(12) United States Patent
Eldridge et al.

(10) Patent No.: US 7,073,254 B2
(45) Date of Patent: *Jul. 11, 2006

(54) METHOD FOR MOUNTING A PLURALITY OF SPRING CONTACT ELEMENTS

(75) Inventors: Benjamin N. Eldridge, Danville, CA (US); Gary W. Grube, Pleasanton, CA (US); Igor Y. Khandros, Orinda, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 273 days.

This patent is subject to a terminal disclaimer.

(21) Appl. No.: 09/753,310

(22) Filed: Dec. 29, 2000

(65) Prior Publication Data

US 2001/0002341 A1 May 31, 2001

Related U.S. Application Data

(60) Division of application No. 08/802,054, filed on Feb. 18, 1997, now Pat. No. 6,482,013, and a continuation-in-part of application No. 08/452,255, filed as application No. PCT/US95/14909 on Nov. 13, 1995, now Pat. No. 6,336,269, said application No. 08/802,054, and a continuation-in-part of application No. 08/340,144, filed as application No. PCT/US94/13373 on Nov. 16, 1994, now Pat. No. 5,917,707, said application No. 08/802,054, and a continuation-in-part of application No. 08/526,246, filed on Sep. 21, 1995, now abandoned, and a continuation-in-part of application No. 08/152,812, filed as application No. PCT/US95/14843 on Nov. 13, 1995, now Pat. No. 5,476,211, and a continuation-in-part of application No. 08/533,584, filed as application No. PCT/US95/14842 on Nov. 13, 1995, now Pat. No. 5,772,451.

(60) Provisional application No. 60/034,053, filed on Dec. 31, 1996, provisional application No. 60/012,027, filed on Feb. 21, 1996, provisional application No. 60/024,555, filed on Aug. 26, 1996, and provisional application No. 60/005,189, filed on May 17, 1996.

(51) Int. Cl.
*H05K 3/00* (2006.01)

(52) U.S. Cl. .................... 29/843; 842/846; 842/874; 174/260; 439/81; 439/83

(58) Field of Classification Search .............. 29/842, 29/843, 846, 847, 874, 825, 878, 879, 851; 174/260; 439/81, 83; 216/11; 228/180.21
See application file for complete search history.

(56) References Cited

U.S. PATENT DOCUMENTS 3,842,189 A  10/1974  Southgate (Continued)

FOREIGN PATENT DOCUMENTS

DE  42 31 704 C1  9/1992

(Continued)

*Primary Examiner*—Carl J. Arbes
(74) *Attorney, Agent, or Firm*—N. Kenneth Burraston

(57) ABSTRACT

Spring contact elements are fabricated by depositing at least one layer of metallic material into openings defined on a sacrificial substrate. The openings may be within the surface of the substrate, or in one or more layers deposited on the surface of the sacrificial substrate. Each spring contact element has a base end portion, a contact end portion, and a central body portion. The contact end portion is offset in the z-axis (at a different height) than the central body portion. The base end portion is preferably offset in an opposite direction along the z-axis from the central body portion. In this manner, a plurality of spring contact elements are fabricated in a prescribed spatial relationship with one another on the sacrificial substrate. The spring contact elements are suitably mounted by their base end portions to corresponding terminals on an electronic component, such as a space transformer or a semiconductor device, whereupon the sacrificial substrate is removed so that the contact ends of the spring contact elements extend above the surface of the electronic component. In an exemplary use, the spring contact elements are thereby disposed on a space transformer component of a probe card assembly so that their contact ends effect pressure connections to corresponding terminals on another electronic component, for the purpose of probing the electronic component.

28 Claims, 10 Drawing Sheets

U.S. PATENT DOCUMENTS

| | | | |
|---|---|---|---|
| 4,480,223 A | 10/1984 | Aigo | |
| 4,486,945 A | 12/1984 | Aigoo | |
| 4,563,640 A * | 1/1986 | Hasegawa | |
| 4,615,573 A | 10/1986 | White et al. | |
| 4,636,722 A | 1/1987 | Ardezzone | |
| 4,916,002 A * | 4/1990 | Carver | 428/139 |
| 4,965,865 A * | 10/1990 | Trenary | |
| 5,070,297 A | 12/1991 | Kwon et al. | |
| 5,090,118 A | 2/1992 | Kwon et al. | |
| 5,092,783 A | 3/1992 | Suarez et al. | |
| 5,103,557 A | 4/1992 | Leedy | |
| 5,166,520 A | 11/1992 | Prater et al. | |
| 5,172,050 A | 12/1992 | Swapp | |
| 5,173,055 A | 12/1992 | Grabbe | |
| 5,177,438 A | 1/1993 | Littlebury et al. | |
| 5,191,708 A | 3/1993 | Kasukabe et al. | |
| 5,210,939 A | 5/1993 | Mallik et al. | |
| 5,228,861 A | 7/1993 | Grabbe | |
| 5,323,035 A | 6/1994 | Leedy | |
| 5,354,712 A | 10/1994 | Ho et al. | |
| 5,382,898 A | 1/1995 | Subramanian | |
| 5,424,254 A | 6/1995 | Damiot | |
| 5,437,556 A | 8/1995 | Bargain et al. | |
| 5,462,440 A | 10/1995 | Rothenberger | |
| 5,465,611 A | 11/1995 | Ruf et al. | |
| 5,476,211 A | 12/1995 | Khandros | |
| 5,476,818 A | 12/1995 | Yanof et al. | |
| 5,495,667 A | 3/1996 | Farnworth et al. | |
| 5,513,430 A * | 5/1996 | Yanof et al. | |
| 5,521,518 A | 5/1996 | Higgins | |
| 5,555,422 A | 9/1996 | Nakano | |
| 5,576,630 A | 11/1996 | Fujita | |
| 5,629,137 A | 5/1997 | Leedy | |
| 5,632,631 A | 5/1997 | Fjelstad et al. | |
| 5,666,190 A | 9/1997 | Quate et al. | |
| 5,723,894 A | 3/1998 | Ueno et al. | |
| 5,742,170 A | 4/1998 | Isaac et al. | |
| 5,772,451 A | 6/1998 | Dozier, II et al. | |
| 5,786,270 A | 7/1998 | Gorrell et al. | |
| 5,828,226 A | 10/1998 | Higgins et al. | |
| 5,917,707 A | 6/1999 | Khandros et al. | |
| 5,983,492 A * | 11/1999 | Fjelstad | |
| 5,994,152 A | 11/1999 | Khandros et al. | |
| 6,029,344 A | 2/2000 | Khandros et al. | |
| 6,059,982 A | 5/2000 | Palagonia et al. | |
| 6,064,213 A | 5/2000 | Khandros et al. | |
| 6,104,087 A * | 8/2000 | DiStefano et al. | |
| 6,117,694 A * | 9/2000 | Smith et al. | |
| 6,150,186 A | 11/2000 | Chen et al. | |
| 6,174,744 B1 | 1/2001 | Watanabe et al. | |
| 6,184,053 B1 | 2/2001 | Eldridge et al. | |
| 6,475,822 B1 | 11/2002 | Eldridge et al. | |
| 6,482,013 B1 | 11/2002 | Eldridge et al. | |
| 6,499,216 B1 * | 12/2002 | Fjelstad | |
| 2001/0015652 A1 | 8/2001 | Eldridge et al. | |
| 2002/0117330 A1 | 8/2002 | Eldridge et al. | |
| 2003/0199179 A1 | 10/2003 | Eldridge et al. | |

FOREIGN PATENT DOCUMENTS

| | | | |
|---|---|---|---|
| EP | 0 315 358 A2 | | 5/1989 |
| EP | 396248 B1 | | 11/1990 |
| JP | 63062343 | | 3/1988 |
| JP | 421650 | | 12/1990 |
| JP | 3105258 | | 5/1991 |
| JP | 518741 | | 1/1993 |
| JP | 5164785 | | 6/1993 |
| JP | 5281259 | | 10/1993 |
| JP | 6018555 | | 1/1994 |
| JP | 6265575 | | 9/1994 |
| JP | 6267408 | | 9/1994 |
| JP | 6273445 | | 9/1994 |
| JP | 6313775 | | 11/1994 |
| JP | 721968 | | 1/1995 |
| JP | 763999 | | 3/1995 |
| JP | 7260802 | | 10/1995 |
| JP | 7333232 | | 12/1995 |
| JP | 7333242 | | 12/1995 |
| JP | 815318 | | 1/1996 |
| JP | 821841 | | 1/1996 |
| JP | 883413 | | 3/1996 |
| JP | 470746 | | 6/1996 |
| WO | WO 95/14314 | * | 5/1995 |
| WO | WO 96/02068 | | 2/1996 |
| WO | WO 96/37332 | | 11/1996 |
| WO | WO 97/43653 | | 11/1997 |

* cited by examiner

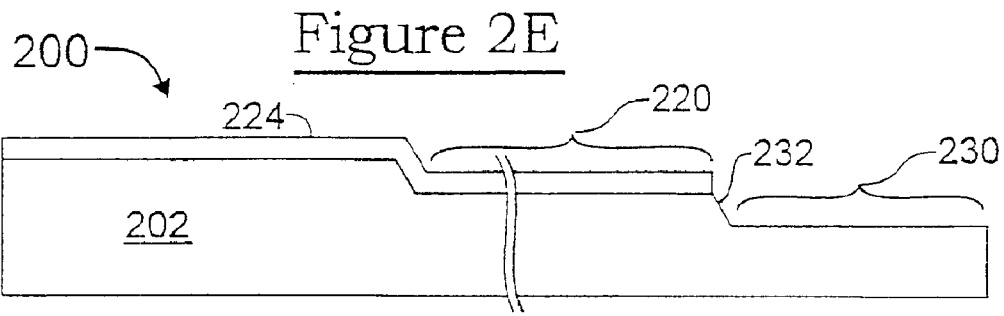
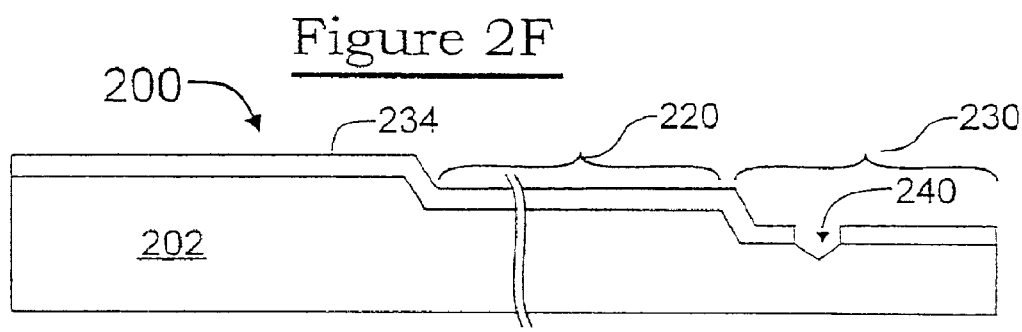
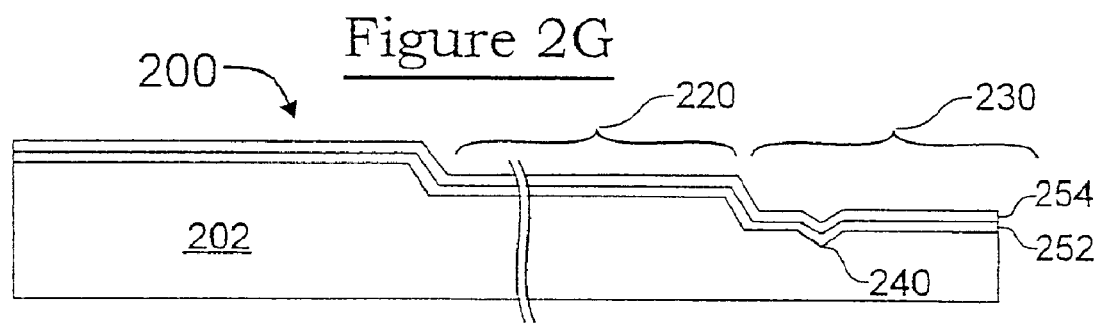
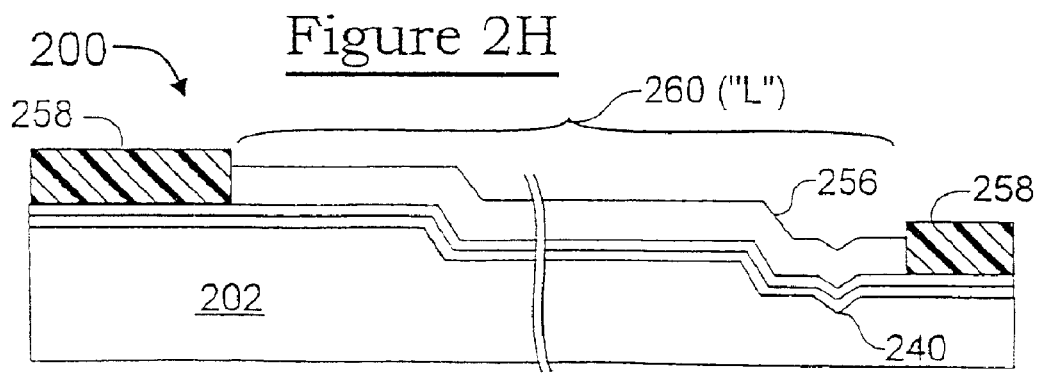

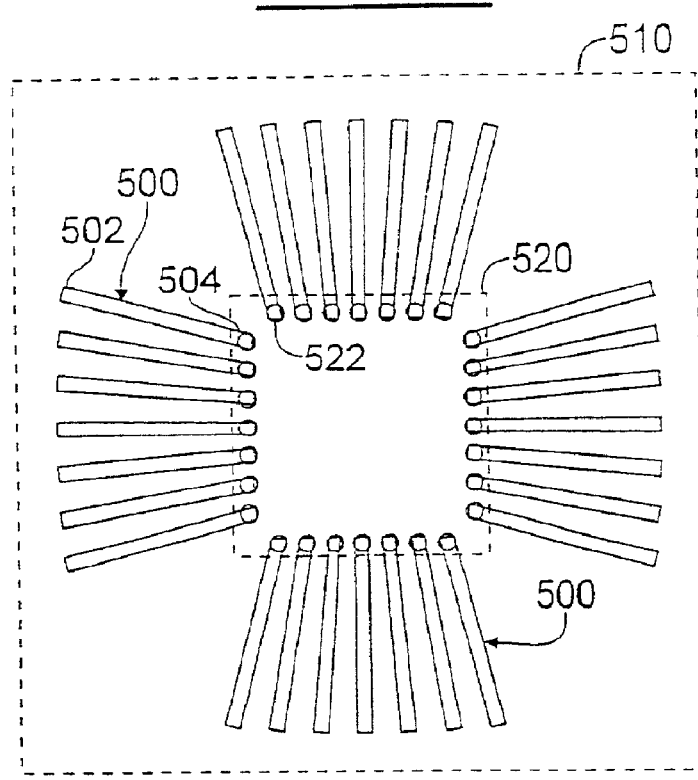
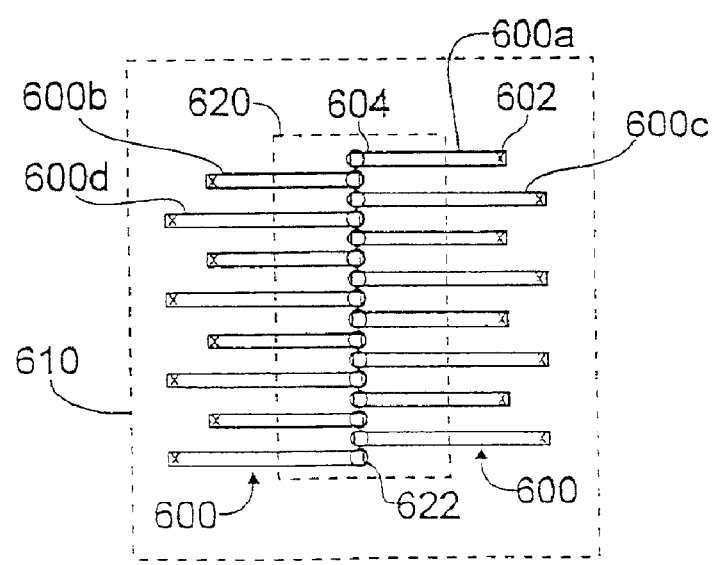

Figure 9A
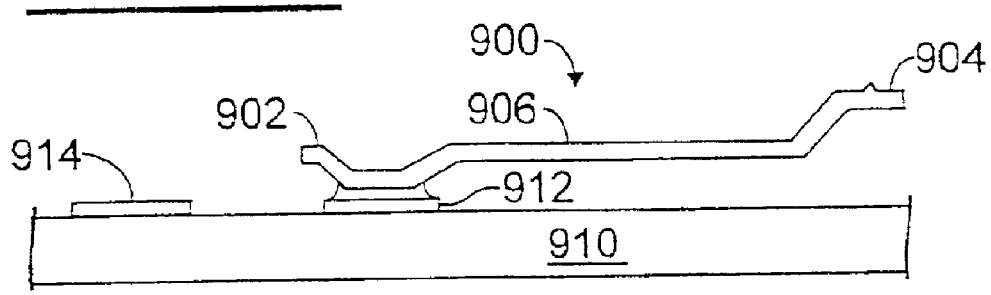
Figure 9B
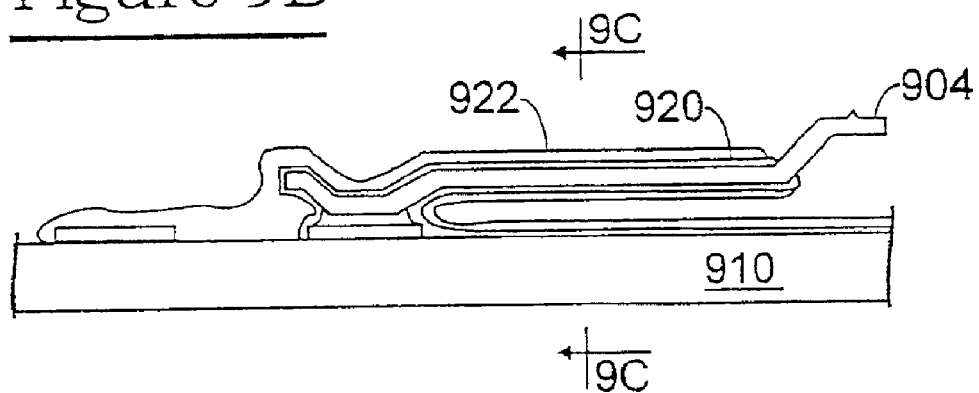
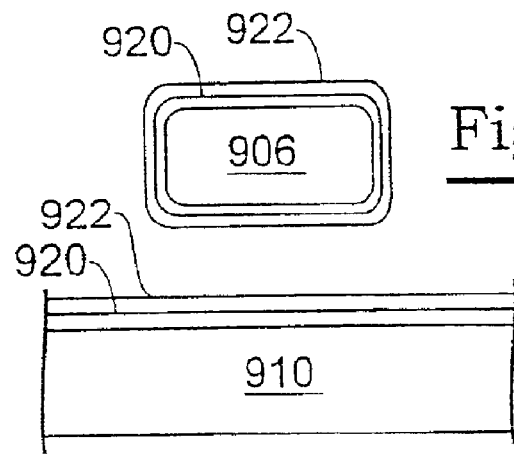
Figure 9C

METHOD FOR MOUNTING A PLURALITY OF SPRING CONTACT ELEMENTS

CROSS-REFERENCE TO RELATED APPLICATIONS

This patent application is a Divisional of Ser. No. 08/802,054 filed on Feb. 18, 1997, now U.S. Pat. No. 6,482,013, and continuation-in-part of commonly-owned, copending U.S. patent application Ser. No. 60/034,053 filed 31 Dec. 96, which is incorporated by reference herein. This patent application is also a continuation-in-part of commonly-owned, U.S. patent application Ser. No. 08/452,255 (hereinafter "PARENT CASE") filed 26 May 95, now U.S. Pat. No. 6,336,269, and its counterpart PCT patent application number PCT/US95/14909 filed 13 Nov. 95, both of which are continuations-in-part of commonly-owned, U.S. patent application Ser. No. 08/340,144 filed 15 Nov. 94, now U.S. Pat. No. 5,917,707, and its counterpart PCT patent application number PCT/US94/13373 filed 16 Nov. 94, now WO Published Application No. 95/14314, both of which are continuations-in-part of commonly-owned, U.S. patent application Ser. No. 08/152,812 filed 16 Nov. 93 (now U.S. Pat. No. 5,476,211, 19 Dec. 95), all of which are incorporated by reference herein.

This patent application is also a continuation-in-part of the following commonly-owned, U.S. patent application Ser. Nos.:

Ser. No. 08/526,246 filed 21 Sep. 95, now abandoned, (PCT/US95/14843, 13 Nov. 95);

Ser. No. 08/533,584 filed 18 Oct. 95, now U.S. Pat. No. 5,772,451, (PCT/US95/14842, 13 Nov. 95);

Ser. No. 08/554,902 filed 09 Nov. 95, now U.S. Pat. No. 5,974,662, (PCT/US95/14844, 13 Nov. 95);

Ser. No. 08/558,332 filed 15 Nov. 95, now U.S. Pat. No. 5,829,128, (PCT/US95/14885, 15 Nov. 95);

Ser. No. 08/602,179 filed 15 Feb. 96, now abandoned, (PCT/US96/08328, 28 May 96);

Ser. No. 60/012,027 filed 21 Feb. 96 (PCT/US96/08117, 24 May 96);

Ser. No. 60/005,189 filed 17 May 96 (PCT/US96/08107, 24 May 96); and

Ser. No. 60/024,555 filed 26 Aug. 96, all of which (other than the provisional patent applications) are continuations-in-part of the aforementioned PARENT CASE, and all of which are incorporated by reference herein.

TECHNICAL FIELD OF THE INVENTION

The present invention relates to resilient electrical contact (interconnection) elements (structures), also referred to as spring contacts, suitable for effecting pressure connections between electronic components and, more particularly, to microminiature spring contacts such as may be used in probing (resiliently and is temporarily contacting) microelectronic components such as active semiconductor devices.

BACKGROUND OF THE INVENTION

Commonly-owned U.S. patent application Ser. No. 08/152,812 filed 16 Nov. 93 (now U.S. Pat. No. 4,576,211, issued 19 Dec. 95), and its counterpart commonly-owned "divisional" U.S. patent applications Ser. Nos. 08/457,479 filed 01 Jun. 95 (now U.S. Pat. No. 6,049,976) and 08/570,230 filed 11 Dec. 95 (now U.S. Pat. No. 5,852,871), all by KHANDROS, disclose methods for making resilient interconnection elements for microelectronics applications involving mounting an end of a flexible elongate core element (e.g., wire "stem" or "skeleton") to a terminal on an electronic component coating the flexible core element and adjacent surface of the terminal with a "shell" of one or more materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Commonly-owned, U.S. Pat. No. 5,917,707 and its corresponding PCT Patent Application No. PCT/US94/13373 filed 16 Nov. 94 (WO95/14314, -published 26 May 95) [underlining from original deleted from previous part], both by KHANDROS and MATHIEU, disclose a number of applications for the aforementioned spring contact element, and also disclosed techniques for fabricating contact pads at the ends of the spring contact elements. For example, in FIG. 14 thereof, a plurality of negative projections or holes, which may be in the form of inverted pyramids ending in apexes, are formed in the surface of a sacrificial layer (substrate). These holes are then filled with a contact structure comprising layers of material such as gold or rhodium and nickel. A flexible elongate element is mounted to the resulting contact structure and can be overcoated in the manner described hereinabove. In a final step, the sacrificial substrate is removed. The resulting spring contact has a contact pad having controlled geometry (e.g., sharp points) at its free end.

Commonly-owned, U.S. patent application Ser. No. 08/452,255 filed 26 May 95 and, now U.S. Pat. No. 6,336,269, its corresponding PCT Patent Application No. PCT/US95/14909 filed 13 Nov. 9 (WO96/17278, -published 06 Jun. 96), both by ELDRIDGE, GRUBE, KHANDROS and MATHIEU, disclose additional techniques and metallurgies for fabricating contact tip structures on sacrificial substrates, as well as techniques for transferring a plurality of spring contact elements mounted thereto, en masse, to terminals of an electronic component (see, e.g., FIGS. 11A–11F and 12A–12C therein).

Commonly-owned, copending U.S. Provisional Patent Application No. 60/024,555 filed 26 Aug. 1996, by ELDRIDGE, KHANDROS and MATHIEU, discloses, for example at FIGS. 2A–2C thereof, a technique whereby a plurality of elongate tip structures having different lengths than one another can be arranged so that their outer ends are disposed at a greater pitch than their inner ends. Their inner, "contact" ends may be collinear with one another, for effecting connections to electronic components having terminals disposed along a line, such as a centerline of the component.

The present invention addresses and is particularly well-suited to making interconnections to modern microelectronic devices having their terminals (bond pads) disposed at a fine-pitch. As used herein, the term "fine-pitch" refers to microelectronic devices that have their terminals disposed at a spacing of less than 5 mils, such as 2.5 mils or 65 μm. As will be evident from the description that follows, this is preferably achieved by taking advantage of the close tolerances that readily can be realized by using lithographic rather than mechanical techniques to fabricate the contact elements.

SUMMARY OF THE INVENTION

An object of the present invention is to provide an improved technique for fabricating spring contact elements.

Another object of the invention is to provide a technique for fabricating spring contact elements using processes that are inherently well-suited to the fine-pitch close-tolerance world of microelectronics.

Another object of the invention is to provide a technique for fabricating spring contact elements that are suitable for probing electronic components such as semiconductor devices, and that is readily scaleable to probing fine-pitch peripheral interconnect structures.

Another object of the invention is to provide a technique for fabricating spring contact elements that are suitable for socketing electronic components such as semiconductor devices, such as for performing burn-in on said devices.

According to the invention, an elongate spring contact element suitable for microelectronic applications is fabricated by forming depressions (such as trenches, such as by etching) in a sacrificial substrate and depositing (such as by plating) metallic materials into the depressions. A plurality of spring contact elements may be fabricated in this manner on a single sacrificial substrate, with lithographically-defined tolerances (e.g., dimensions, spacings).

The resulting spring contact elements may then be mounted to another substrate such as a passive substrate or an active substrate such as a semiconductor device, after which the sacrificial substrate is removed.

An exemplary spring contact element formed in this manner has a length "L" between its base end and its contact end. The base end is preferably offset in a first direction from a central portion of the spring contact element, and the contact end is preferably offset in an opposite direction from the central portion. In this manner, the overall spring contact element is not planar and, when its base end is mounted to an electronic component, its contact end extends above the surface of the electronic component to which it is mounted.

An exemplary sacrificial substrate upon which the spring contact elements may be fabricated is a silicon wafer, in which case the process of the present invention advantageously utilizes the directionally selective etching of silicon used for micromachining processes to create an electroform which is used to place up the final spring contact element. This approach may optionally employ laser-based ablation of photoresist, as opposed to lithographic development of the photoresist, in order to create the high aspect ratio of width to height which is required for fine pitch spacings between the spring contact elements.

An exemplary application for the spring contact elements of the present invention is as probe elements used to effect pressure connections between a substrate and a device-under-test (DUT), in which case the spring contact elements are suitably mounted to a space transformer component of a probe card assembly, such as is described in the aforementioned U.S. Pat. No. 5,974,662 and PCT/US95/14844. Alternatively, the spring contact elements are mounted to and extend from an active electronic component such as an application specific integrated circuit (ASIC).

The spring contact element is suitably formed of at least one layer of a metallic material selected for its ability to cause the resulting contact structure to function, in use, as a spring (i.e., exhibit elastic deformation) when force is applied to its contact (free) end.

The resulting spring contact element is preferably "long and low", having:

a length "L", as measured from one end to another end;

a height "H" measured transverse the length in a direction that is normal (z-axis) to the surface of the sacrificial substrate (and normal to the component to which the spring contact element is ultimately mounted);

a contact end portion which is offset in a one direction (e.g., negative along the z-axis) from a central portion of the spring element by a distance "d1"; and a base end portion which is offset in one direction (e.g., positive z-axis) from the central portion of the spring element by a distance "d2".

The spring contact element is preferably tapered from the one (base) end to the other (contact) end thereof, the spring contact element having the following dimensions:

a width "w1" at its base end as measured parallel to the surface of the sacrificial substrate and transverse to the longitudinal axis of the spring element;

a width "w2" at its contact end as measured parallel to the surface of the sacrificial substrate and transverse to the longitudinal axis of the spring element;

a thickness "t1" at its base end, measured along the z-axis; and a thickness "t2" at its contact end, measured along the z-axis;

resulting in:

a widthwise taper angle "α" (alpha); and a thickness taper angle "β" (beta).

The spring contact element is also suitably provided with a projecting feature at its contact end, said feature having a dimension "d3" measured along the z-axis.

There is thus described herein an exemplary spring contact element suitable for effecting connections between two electronic components, typically being mounted by its base end to a one of the two electronic components and effecting a pressure connection with its contact end (e.g., by the projecting feature) to an other of the two electronic components, having the following dimensions (in mils, unless otherwise specified):

| dimension | range | preferred |
| --- | --- | --- |
| L | 10–1000 | 60–100 |
| H | 4–40 | 5–12 |
| d1 | 3–15 | 7 ± 1 |
| d2 | 0–15 | 7 ± 1 |
| d3 | 0.25–5 | 3 |
| w1 | 3–20 | 8–12 |
| w2 | 1–10 | 2–8 |
| t1 | 1–10 | 2–5 |
| t2 | 1–10 | 1–5 |
| α | 0–30° | 2–6° |
| β | 0–30° | 0–6° |

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting.

Although the invention will be described in the context of these preferred embodiments, it should be understood that it is not intended to limit the spirit and scope of the invention to these particular embodiments.

Certain elements in selected ones of the drawings are illustrated not-to-scale, for illustrative clarity.

Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199*a*, 199*b*, 199*c*, etc.

Figure 1A:
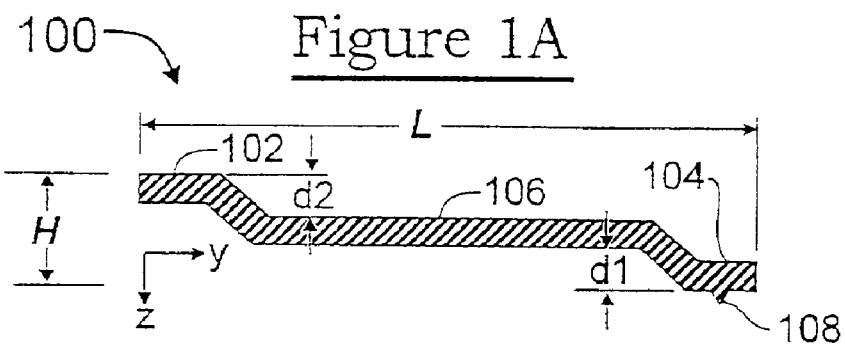

FIG. 1A is a cross-sectional view of a spring contact element, according to the invention.

Figure 1B:
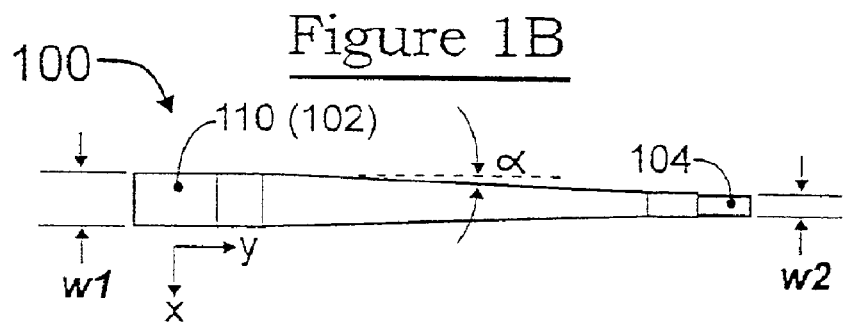

FIG. 1B is a plan view of the spring contact element of FIG. 1A, according to the invention.

Figure 1C:
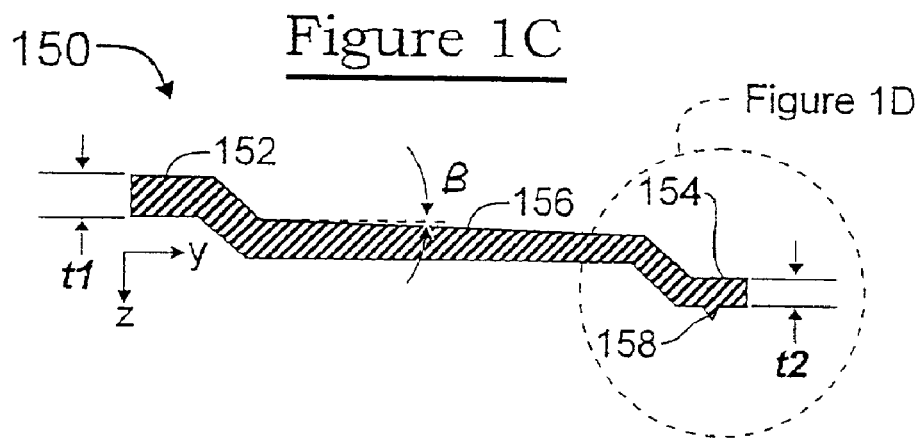

FIG. 1C is a cross-sectional view of an alternate embodiment of a spring contact element, according to the invention.

Figure 1D:
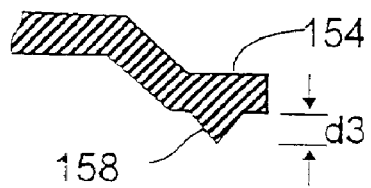

FIG. 1D is an enlarged cross-sectional view of the spring contact element of FIG. 1C.

Figure 1E:
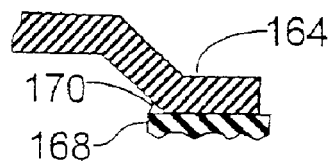

FIG. 1E is a cross-sectional view of an alternate embodiment or a spring contact element, according to the invention.

FIGS. 2A–2I are cross-sectional views of a technique for fabricating spring contact elements on a sacrificial substrate, according to the invention.

Figure 2A:
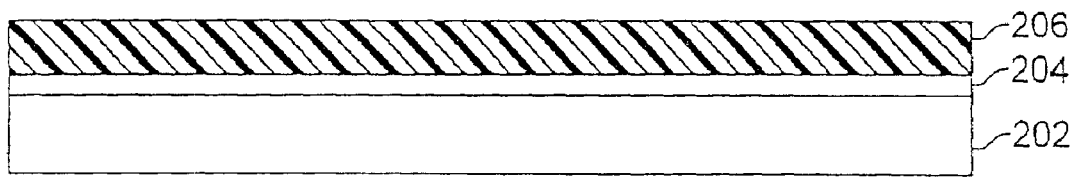
Figure 2B:
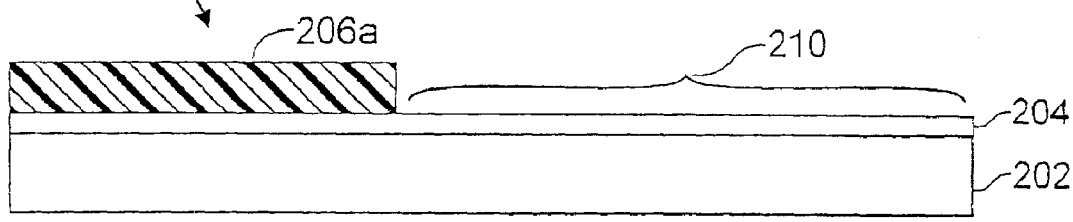
Figure 2C:
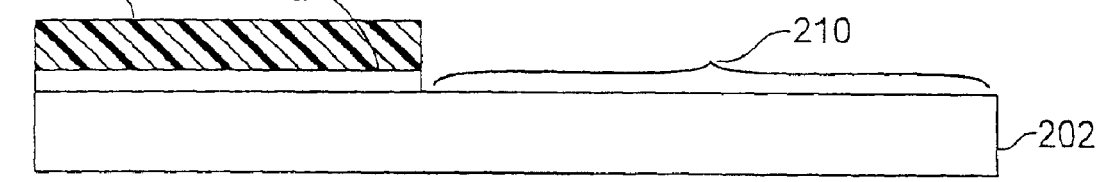
Figure 2D:
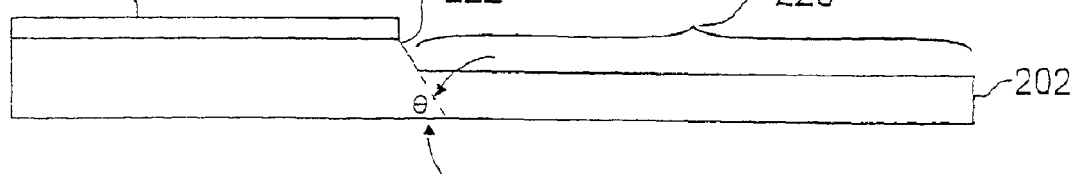
Figure 2I:
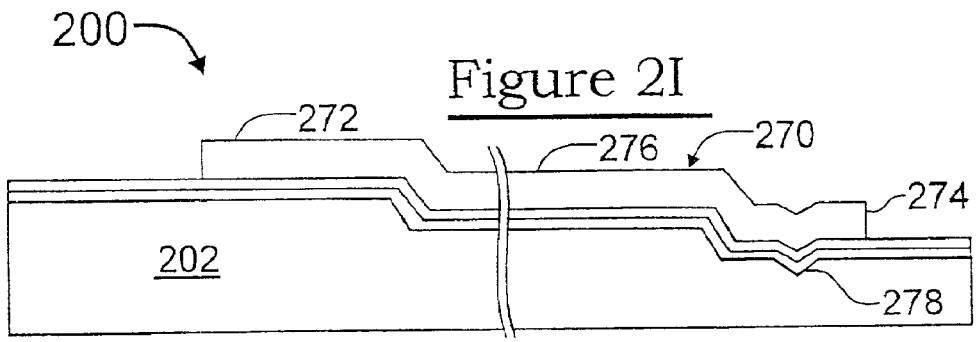
Figure 2J:
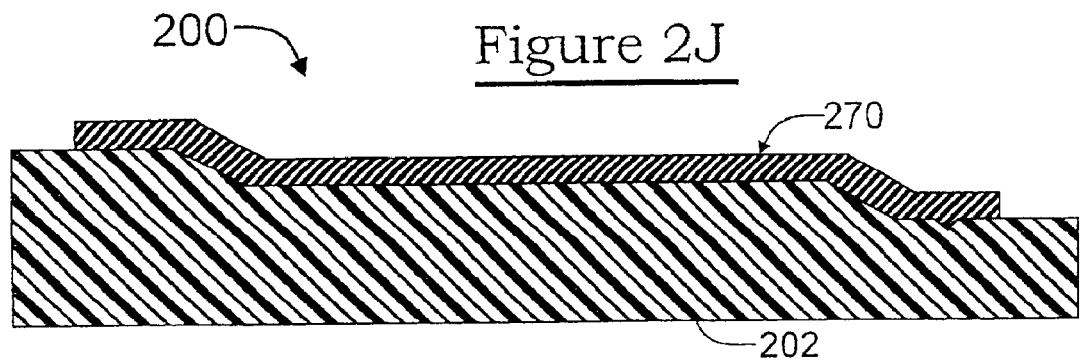

FIG. 2J is a cross-sectional view of a spring contact element residing on a sacrificial substrate, according to the invention.

Figure 3A:
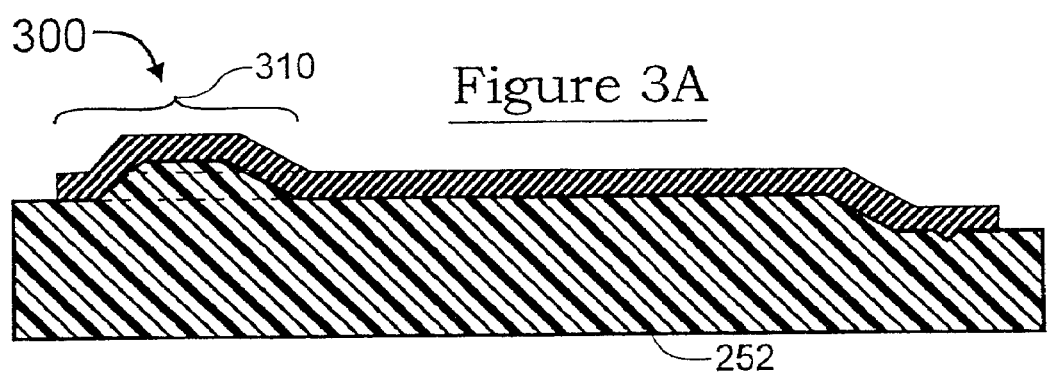

FIG. 3A is a cross-sectional view of an alternate embodiment of a spring contact element residing on a sacrificial substrate, according to the invention.

Figure 3B:
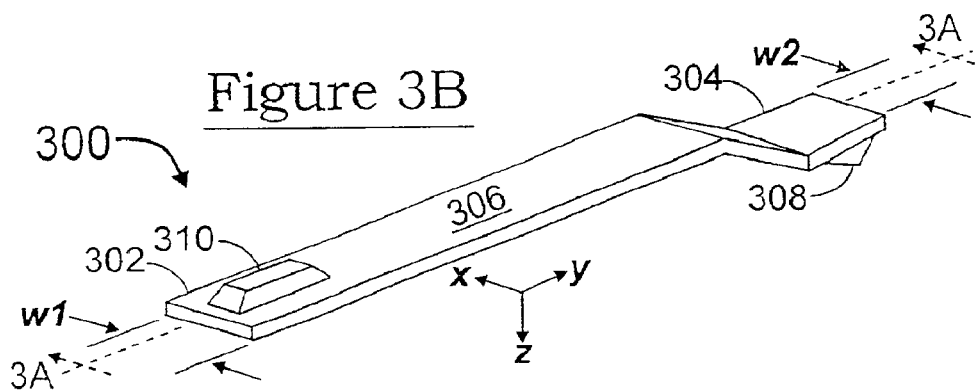

FIG. 3B is a perspective view of the spring contact element of FIG. 3A, omitting a showing of the sacrificial substrate, according to the invention.

Figure 4A:
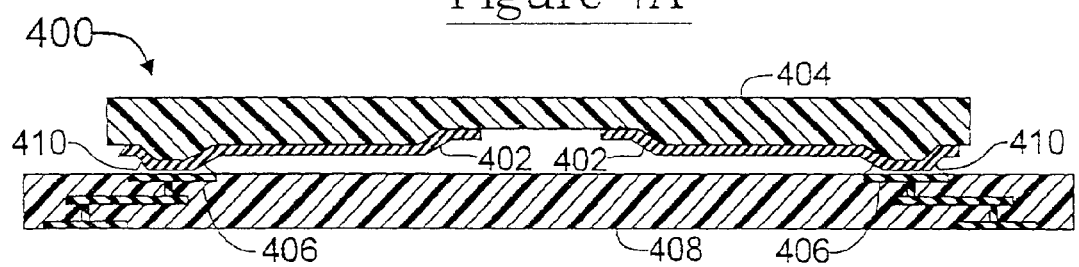
Figure 4B:
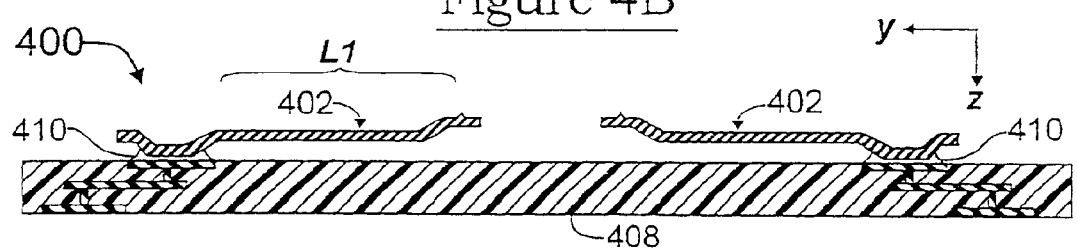

FIGS. 4A–4B are cross-sectional views illustrating a technique for mounting a plurality of spring contact elements which initially are resident on a sacrificial substrate to another component such as a space transformer, according to the invention.

Figure 4C:
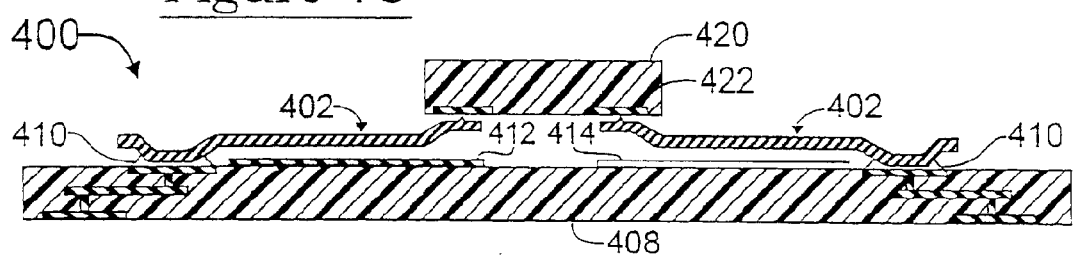

FIG. 4C is a cross-sectional view of a plurality of spring contact elements mounted to a component such as a space transformer, in use, probing (making temporary pressure connections with) another component such as a semiconductor device, according to the invention.

Figure 4D:
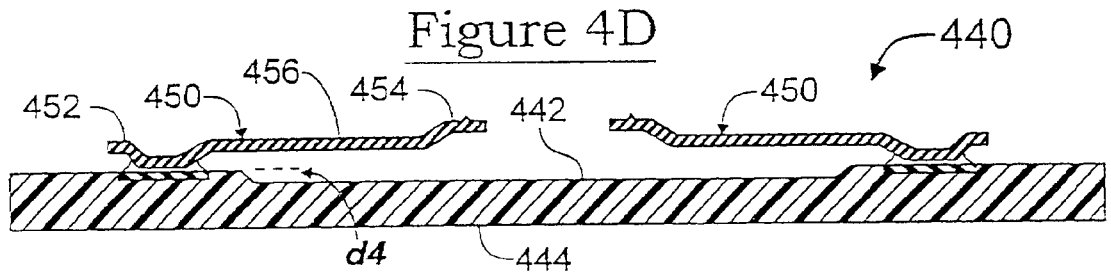

FIG. 4D is a cross-sectional view of another embodiment (compare FIG. 4B) of a technique for mounting a plurality of spring contact elements to another component such as a space transformer, according to the invention.

Figure 4E:
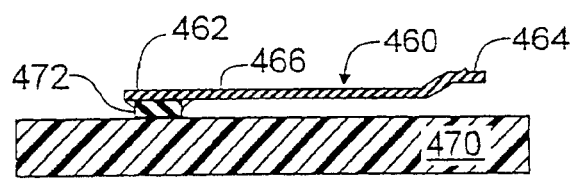

FIG. 4E is a cross-sectional view of another embodiment (compare FIG. 4B) of a technique for mounting a plurality of spring contact elements to another component such as a space transformer, according to the invention. This figure also illustrates another embodiment of a spring contact element, according to the invention.

Figure 4F:
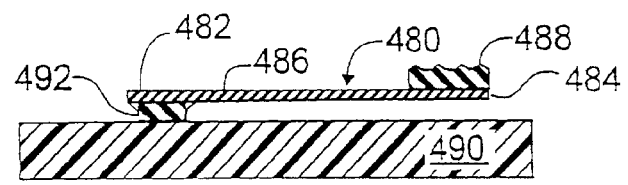

FIG. 4F is a cross-sectional view of another embodiment (compare FIG. 4E) of a technique for mounting a plurality of spring contact elements to another component such as a space transformer, according to the invention. This figure also illustrates another embodiment of a spring contact element, according to the invention.

FIG. 5 is a schematic (stylized) plan view illustration of an application (use) for the spring contact elements of the present invention.

FIG. 6 is a schematic (stylized) plan view illustration of another application (use) for the spring contact elements of the present invention.

Figure 7A:
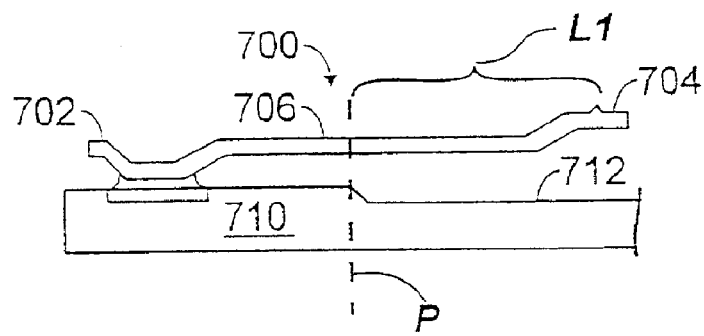

FIG. 7A is a cross-sectional view of another embodiment (compare FIG. 4D) of a technique for mounting a spring contact element to another component such as a space transformer, according to the invention.

Figure 7B:
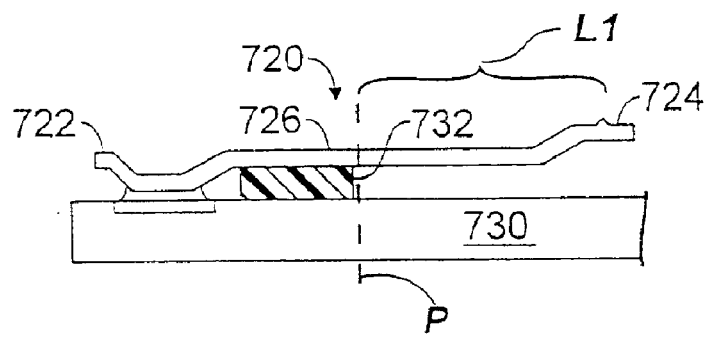

FIG. 7B is a cross-sectional view of another embodiment (compare FIG. 7A) of a technique for mounting a spring contact element to another component such as a space transformer, according to the invention.

Figure 7C:
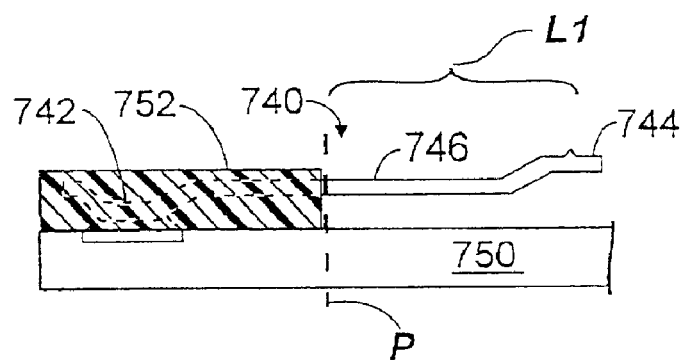

FIG. 7C is a cross-sectional view of another embodiment (compare FIG. 7A) of a technique for mounting a spring contact element to another component such as a space transformer, according to the invention.

Figure 7D:
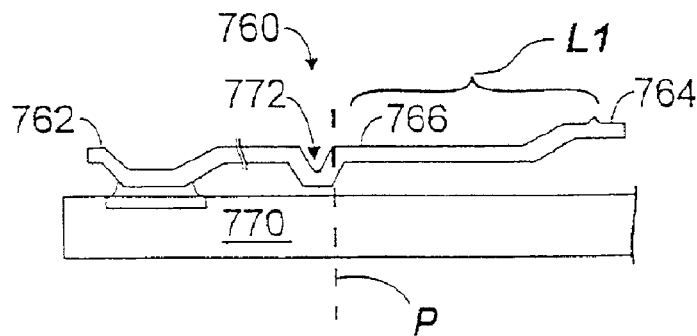

FIG. 7D is a cross-sectional view of another embodiment (compare FIG. 7A) of a technique for mounting a spring contact element to another component such as a space transformer, according to the invention.

Figure 8A:
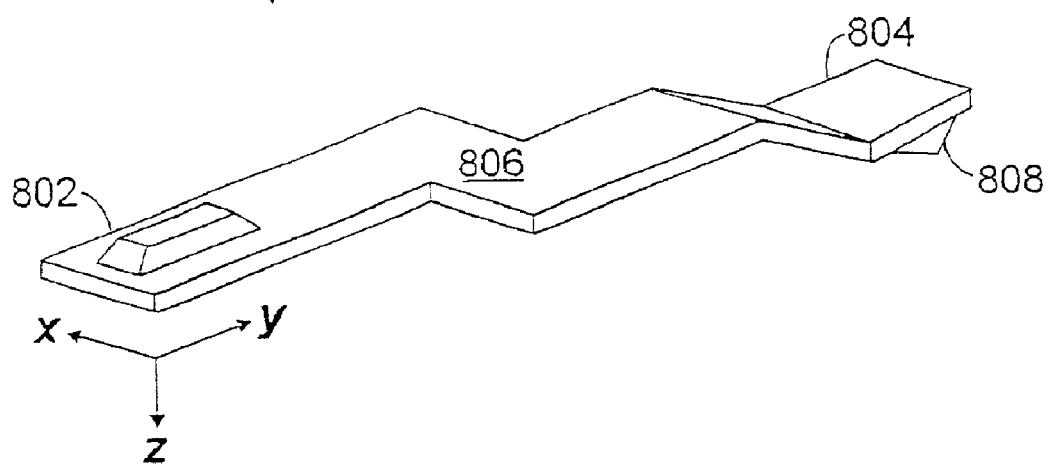

FIG. 8A is a perspective view of an alternate embodiment of a spring contact element (compare FIG. 3B), omitting a showing of the sacrificial substrate, according to the invention.

Figure 8B:
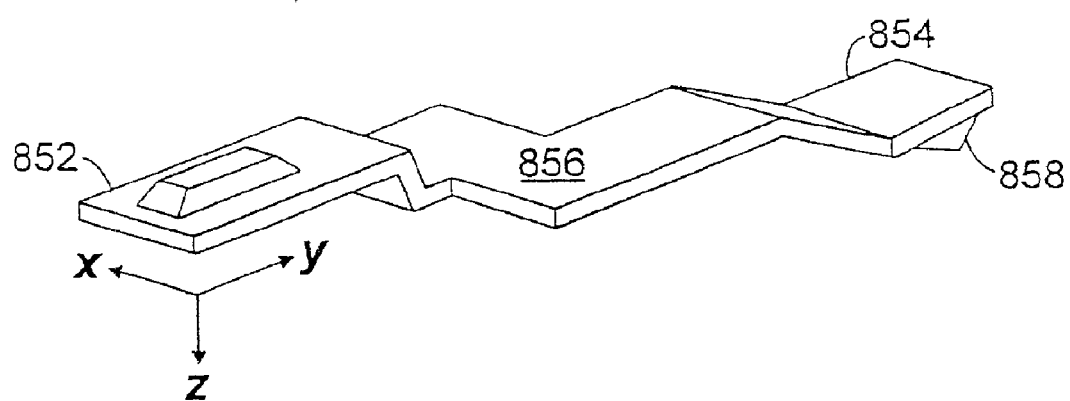

FIG. 8B is a perspective view of an alternate embodiment of a spring contact element (compare FIG. 8A), omitting a showing of the sacrificial substrate, according to the invention.

FIG. 9A is a side cross-sectional view of a first step in a technique for achieving controlled impedance in a spring contact element according to the invention.

FIG. 9B is a side cross-sectional view of a next step in the technique for achieving controlled impedance in a spring contact element, according to the invention.

FIG. 9C is an end cross-sectional view of the controlled impedance spring contact element of FIG. 9B, according to the invention.

DETAILED DESCRIPTION OF THE INVENTION

Commonly-owned, U.S. Pat. No. 5,974,662 and its corresponding PCT Patent Application No. PCT/US95/14844 filed 13 Nov. 95 (WO96/15458, -published 23 May 96), both by ELDRIDGE, GRUBE, KHANDROS and MATHIEU, disclose a probe card assembly which includes elongate resilient (spring) contact elements mounted to a "space transformer" component. As used herein, a space transformer is a multilayer interconnection substrate having terminals disposed at a first pitch on a one surface thereof and having corresponding terminals disposed at a second pitch on an opposite surface thereof, and is used to effect "pitch-spreading" from the first pitch to the second pitch. In use, the free ends (tips) of the elongate spring contact elements make pressure connections with corresponding terminals on an electronic component being probed (e.g., tested).

Elongate, Resilient Cantilever-Like Contact Element

FIGS. 1A and 1B illustrate an elongate resilient (spring) contact element 100 that is suitable for attachment as a free-standing structure to an electronic component including, but not limited to, the space transformer of the aforementioned probe card assembly.

The structure 100 is elongate, has two ends 102 and 104, a central portion 106 therebetween, and has an overall longitudinal length of "L" between the two ends. The length "L" is in the range of 10–1000 mils, such as 40–500 mils or 40–250 mils, preferably 60–100 mils. As will become apparent from the discussion that follows, in use the structure has an effective length of "L1", less than "L", which is the length over which the structure can flex in response to a force applied thereto.

The end 102 is a "base" whereat the contact element 100 will be mounted to an electronic component (not shown). The end 104 is a "free-end" (tip) which will effect a pressure connection with another electronic component (e.g., a device-under-test, not shown). Although not illustrated, it is also possible that the contact element 100 has an elongate "tail" portion extending beyond the base end 102, opposite the central portion 106.

The structure 100 has an overall height of "H". The height "H" is in the range of 4–40 mils, preferably 5–12 mils. (1 mil=0.001 inches)

As best viewed in FIG. 1A, the structure is "stepped". The base portion 102 is at a first height, the tip 104 is at another height, and a middle (central) portion 106 is at a third height which is between the first and second heights. Therefore, the structure 100 has two "standoff" heights, labelled "d1" and "d2" in the figure. In other words, the spring contact element 100 has two "steps", a step up from the contact end 104 to the central body portion 106, and a further step up from the central body portion 106 to the base end 102.

In use, the standoff height "d1", which is the "vertical" (as viewed in FIG. 1A) distance between the tip 104 and the central portion 106, performs the function of preventing bumping of the structure (contact element) with a surface of a component being contacted by the tip end 104.

In use, the standoff height "d2", which is the "vertical" (as viewed in FIG. 1A) distance between the base 102 and the central portion 106, performs the function of allowing the beam (contact element) to bend through the desired overtravel.

The dimensions for the standoff heights "d1" and "d2" are:

"d1" is in the range of 3–15 mils, preferably approximately 7 mils÷1 mil; and

"d2" is in the range of 0–15 mils, preferably approximately 7 mils÷1 mil. In the case of "d2" being 0 mil, the structure would be substantially planar (without the illustrated step) between the central portion 106 and the base portion 102.

As best viewed in FIG. 1B, the structure 100 is preferably provided with a "joining feature" 110 at its base portion 102. The joining feature may be a tab or, optionally a stud, which is used to facilitate brazing the probe structure to a substrate (e.g., a space transformer or a semiconductor device) during assembly therewith. Alternatively, the component or substrate to which the structure 100 is mounted may be provided with a stud or the like to which the base portion 102 is mounted.

In use, the structure 100 is intended to function as a cantilever beam, and is preferably provided with at least one taper angle, labelled "α" in FIG. 1B. For example, the width "w1" of the structure 100 at its base end 102 is in the range of 5–20 mils, preferably 8–12 mils, and the width "w2" of the structure 100 at its tip end 104 in the range of 1–10 mils, preferably 2–8 mils, and the taper angle "α" is preferably in the range of 2–6 degrees. The narrowing of (taper) the structure 100, from its base 102 to its tip 104, permits controlled flexure and more even stress distribution (versus concentration) of the structure 100 when its base 102 is secured (immovable) and a force is applied at its tip (104).

As will be evident in the discussion presented hereinbelow, the width of the structure (hence, the taper angle "α") is readily controlled employing well-known lithographic techniques.

The tip end 104 of the structure 100 is preferably provided with an integral protruding topological feature 108, for example in the geometric form of a pyramid, to aid in effecting pressure connection to a terminal of an electronic component (not shown).

As illustrated in FIGS. 1A and 1B, the spring contact element 100 is three-dimensional, extending in the x- y- and z-axes. Its length "L" is along the y-axis, its widths ("w1" and "w2") is along the x-axis, and its thicknesses ("t1" and "t2") and height ("H") are along the x-axis. As will become evident in the discussion set forth hereinbelow (see, e.g., FIG. 4B), when the spring contact element 100 is mounted to an electronic component, it is mounted thereto so that the length and width of the spring contact element are parallel to the surface of the electronic component, and its height is normal to the surface of the electronic component.

FIG. 1C illustrates a contact structure 150 similar in most respects to the structure 100 of FIGS. 1A and 1B. The structure is elongate, has a base end 152 (compare 102) and a tip end 154 (compare 104), and a topological feature 158 (compare 108) incorporated into its tip end. The principal difference being illustrated in FIG. 1C is that the structure can be provided with a second taper angle "β".

As best viewed in FIG. 1C, the thickness "t1" of the structure 100 at its base end 102 is in the range of 1–10 mils, preferably 2–5 mils, and the thickness "t2" of the structure 100 at its tip end 104 in the range of 1–10 mils, preferably 1–5 mils, and the taper angle "β" is preferably in the range of 2–6 degrees.

The angle "β" (FIG. 1C) may be created using various methods for controlling the thickness distribution. For example, if the structure 100 is formed by plating, a suitable plating shield can be incorporated into the bath. If the structure 100 is formed other than by plating, appropriate known processes for controlling the spatial distribution of thickness of the resulting structure would be employed. For example, sandblasting or electro-discharge machining (EDM) the structure 100.

Thus, the structure suitably has a composite (dual) taper from its base end 102 to its tip end 104. It has a taper angle "α" which, as will be evident from the description of a contact structure mounted to a component or substrate set forth hereinbelow, is parallel to the x-y plane of the substrate or component to which the contact structure 100 is mounted. And it has a has a taper angle "β" which represents a narrowing of the structure's cross section (z-axis).

It is within the scope of this invention that the structure is not tapered in width, in which case the taper angle "α" would be ZERO. It is also within the scope of this invention that the taper angle "α" is greater than 2–6 degrees, for example as much as 30 degrees. It is within the scope of this invention that the structure is not tapered in thickness, in which case the taper angle "β" would be ZERO. It is also within the scope of this invention that the taper angle "β" is greater than 2–6 degrees, for example as much as 30 degrees. It is within the scope of this invention that the structure (contact element) is tapered only in thickness and not in width, or only in width and not in thickness.

It is within the scope of this invention that the contact element is tapered to be wider and/or thicker at its contact end 104 than at its base end 102, rather than narrower and/or thinner as described above. It is also possible that the contact element is provided with a plurality of different tapers, for example, tapering in (e.g., wider to narrower) from the base end to the central portion, then tapering back out (e.g., narrow to wider) towards the contact end.

The contact structures 100 and 150 are principally, preferably entirely, metallic, and may be formed (fabricated) as multilayer structures, as is described in greater detail hereinbelow. Suitable materials for the one or more layers of the contact structures include but are not limited to:

nickel, and its alloys;
copper, cobalt, iron, and their alloys;
gold (especially hard gold) and silver, both of which exhibit excellent current-carrying capabilities and good contact resistivity characteristics;
elements of the platinum group;
noble metals;
semi-noble metals and their alloys, particularly elements of the palladium group and their alloys; and
tungsten, molybdenum and other refractory metals and their alloys.

In cases where a solder-like finish is desired, tin, lead, bismuth, indium and their alloys can also be used.

FIG. 1D shows an enlarged view of the contact end 154 of the contact structure 150 (equally applicable to the contact ends of other contact structures illustrated herein). In this enlarged view it can be seen that the contact feature 154 is suitably quite prominent, projecting a distance "d3", in the range of 0.25–5 mils, preferably 3 mils from the bottom (as viewed) surface of the contact end of the spring contact element, and is suitably in the geometric shape of a pyramid, a truncated pyramid, a wedge, a hemisphere, or the like.

The resulting spring contact element has an overall height "H" which is the sum of "d1", "d2" (and "d3") plus the thickness of the central body portion.

There has thus been described a exemplary spring contact element suitable for effecting connections between two electronic components, typically being mounted by its base end to a one of the two electronic components and effecting a pressure connection with its contact end to an other of the two electronic components, having the following dimensions (in mils, unless otherwise specified):

| dimension | range | preferred |
| --- | --- | --- |
| L | 10–1000 | 60–100 |
| H | 4–40 | 5–12 |
| d1 | 3–15 | 7 ± 1 |
| d2 | 0–15 | 7 ± 1 |
| d3 | 0.25–5 | 3 |
| w1 | 3–20 | 8–12 |
| w2 | 1–10 | 2–8 |
| t1 | 1–10 | 2–5 |
| t2 | 1–10 | 1–5 |
| α | 0–30° | 2–6° |
| β | 0–30° | 0–6° | from which the following general relationships are evident:

"L" is approximately at least 5 times "H";
"d1" is a small fraction of "H", such as between one-fifth and one-half the size of "H";
"w2" is approximately one-half the size of "w1", and is a small fraction of "H", such as between one-tenth and one-half the size of "H"; and
"t2" is approximately one-half the size of "t1", such as between one-tenth and one-half the size of "H".

Another dimension is of interest—namely, the width and length (i.e., footprint) of the overall tip end (104). In instances where the tip end is expected to make contact with a terminal of an electronic component which is recessed (e.g., a bond pad of a semiconductor device which has passivation material surrounding the bond pad), it may be desirable to ensure that the footprint of the tip end is sufficiently small to make such contact. For example, less than 4 mils by 4 mils). Else, it must be ensured that the contact feature (108) is of sufficient height (d3) to make contact with the recessed terminal. Generally speaking, the selection or an appropriate tip end design will be dictated by the peculiarities of the given application. For example, for contacting bond pads on silicon devices, the tip end design illustrated in FIG. 1D would likely be most appropriate. For contacting C4 bumps, the tip end design illustrated in FIG. 1E (described hereinbelow) would likely be most appropriate.

FIG. 1E illustrates an alternate embodiment of the invention wherein discrete contact tip structures 168, such as are described in the aforementioned PCT/US96/08107 can be mounted to the contact end portions 164 of the spring contact elements, such as by brazing 170 thereto. This provides the possibility of the contact tip structure 168 having a different metallurgy, than the spring contact element (150). For example, the metallurgy of the spring contact element (150) is suitably targeted at its mechanical (e.g., resilient, spring) characteristics and its general capability to conduct electricity, while the metallurgy of a contact tip structure 168 mounted thereto is appropriately targeted to making superior electrical connection with a terminal (see, e.g., 420, hereinbelow) of an electronic component (see, e.g., 422, hereinbelow) being contacted and, if needed, can have superior wear-resistance.

Fabricating the Contact Structure

A contact element such as that described hereinabove would be difficult, to punch out of a foil of spring material and mount in a precise location on an electronic component such as a space transformer, at the scale (dimensions) described herein.

According to an aspect of the invention, processes such as photolithography are employed to fabricate the spring contact elements of the present invention with tolerances, both of the springs themselves and with regard to the relative locations of a plurality of springs, suitable for use as interconnections in the context of fine-pitch microelectronics.

FIGS. 2A–2J illustrates an exemplary process 200 for fabricating the aforementioned resilient contact structures 100 (150). The present invention is not limited to this exemplary process.

As illustrated in FIG. 2A, commencing with a suitable sacrificial substrate 202, such as a silicon wafer, a blanket layer 204 of silicon nitride ("nitride") is applied to the surface of the sacrificial substrate. This layer 204 will act as an etch stop in subsequent steps of the process. A layer 206 of a masking material, such as photoresist, is applied over the nitride layer 204, and is imaged and developed using conventional photolithographic techniques (e.g., actinic light passing through a mask).

It is within the scope of this invention that the sacrificial substrate is a material selected from the group consisting of silicon, aluminum, copper, ceramic, and the like. For example, silicon in the form of a silicon semiconductor wafer. Or aluminum or copper in the form of a foil or sheet. Or, aluminum or copper in the form of a layer on another substrate. The sacrificial substrate can also be a "clad" (multilayer) structure, such as copper-invar-copper or aluminum-alumina-aluminum, and preferably has a coefficient of thermal expansion which matches that of the component to which the contact structures are ultimately mounted. The example set forth herein, vis-a-vis the "machining" of the sacrificial substrate is applicable to sacrificial substrates which are silicon. One of ordinary skill in the art to which the present invention most nearly pertains will readily understand how to achieve comparable results with sacrificial substrates formed of other (than silicon) materials. It is within the scope of this invention that the sacrificial substrate can be formed of titanium-tungsten which is readily etched with hydrogen peroxide.

Using conventional chemical etching techniques, an opening 210 to the surface of the sacrificial substrate 202 can be created through both of the layers 206 and 204, as illustrated in FIG. 2C. In the area of the opening 210, the surface of the sacrificial substrate is exposed. The surface of the sacrificial substrate is covered by the residual (remaining) portions 204a and 206a of the layers 204, 206, respectively, that are not removed by etching.

Alternatively, as illustrated in FIG. 2B, selected portions of the photoresist 206 can be removed employing other techniques, such as known techniques involving lasers, E-beam, and the like, and the resulting exposed (no longer covered) portions of the nitride layer 204 can be removed using chemical etching processes, the result of which is that an opening 210 to the surface of the sacrificial substrate 202 can be created, as illustrated in FIG. 2C. Using a laser to remove portions of the masking layer 206 (other portions 206a being remaining portions) provides the possibility of having more carefully-controlled aspect ratios for the resulting openings 210, for example, obtaining steeper and deeper, more-vertical sidewalls in the opening.

In a next step of the process 200, illustrated in FIG. 2D, the sacrificial substrate 202 is etched in the openings 210 through the nitride layer 204, using known chemistry for selectively etching the substrate. For example, a silicon substrate can selectively be etched (with respect to nitride) using potassium hydroxide (KOH). This will create a trench 220 in the substrate 202, the depth of which is controlled to correspond to the aforementioned standoff height "d2" (see FIG. 1A). Also, in the case of employing a silicon wafer as the substrate 202, the sidewall 222 of the trench will favorably exhibit a non-vertical angle "θ", such as 54.74° (rather than 90°), as may be inherent in and controlled by the crystalline structure of the substrate. For example, a silicon substrate having a (100) crystal orientation when etched will etch in the (111) planes.

After creating the trench 220, the residual portion 204a of the etch stop layer 204 is preferably removed.

In a next step of the process 200, illustrated in FIG. 2E, the previous steps illustrated and described with respect to FIGS. 2A–2D are repeated, to create another trench 230 in the sacrificial substrate 202 that is longitudinally offset from and contiguous with the trench 220. Alternatively, the trench 230 can be formed in an end portion (right hand side, as viewed) of the previously-formed trench 220. In other words, an etch stop layer 224 (compare 204) is applied, a masking layer (not shown, compare 206) is applied over the etch stop layer, an opening is created through the masking layer and the etch stop layer, and the substrate is etched. This will result in a trench 230 in the substrate 202, the depth of which is controlled to correspond to the aforementioned standoff height "d1" (see FIG. 1A). Also, as mentioned hereinabove, in the case of employing a silicon wafer as the substrate 202, the sidewall 232 of the trench 230 will favorably be "angled", rather than vertical.

In a next step of the process 200, illustrated in FIG. 2F, the previous steps illustrated and described with respect to FIGS. 2A–2D are repeated, to create a small geometric intrusion (depression) 240 (compare "d3" of FIG. 1D) in the sacrificial substrate 202 in the bottom of the second trench 230. (The term "intrusion" is selected as being the complement to "negative of" the resulting protruding feature (108) that will be fabricated on the resulting spring contact element. The feature 240 could also be considered to be a "depression", a "recess", an "indentation" or an "intaglio".) Namely, an etch stop layer 234 (compare 204, 224) is applied, a masking layer (not shown, compare 206) is applied over the etch stop layer, a small opening is created through the masking layer and the etch stop layer, and the substrate is etched. The shape of the intrusion 240 is suitably that of an inverted (as viewed) pyramid and, as mentioned hereinabove, may suitably have sides at the crystalline angle of silicon. As will be evident from the description hereinbelow, this intrusion 240 will define the topological feature 108 present on the tip of the contact structure 100 described hereinabove (pyramid, truncated pyramid, etc.). Finally, the nitride layer 234 is removed.

Each of the trenches 220 and 230 can be considered to be a "subtrench" of a larger overall trench which also includes the depression 240.

The steps described in FIGS. 2A–2F describe the preparation of a sacrificial substrate for the fabrication of resilient contact structures thereon. It is within the scope of this invention that certain of the steps described hereinabove could be performed in other than the recited order. For example, the trench 230 could be formed prior to forming the trench 220.

It bears mention here that it is within the scope of this invention that the process described hereinabove could be carried out on a silicon wafer that has active devices already formed therein. However, as is evident, the forming of trenches (220 and 230) and features (240) could well destroy the active devices unless (i) they were to be formed at areas of the wafer that do not contain active devices, or (ii) the spring contact elements were fabricated on a sacrificial substrate then attached to active devices (see e.g., FIGS. 4A–4B hereinbelow), or (iii) a layer of material suitable for performing the function of the sacrificial substrate (202) described hereinabove is first applied to the surface of the wafer.

As described hereinabove, the sacrificial substrate has been prepared with a first trench 220 which is lower than (extends into) the surface of the substrate, a second trench 230 which is lower than (extends deeper into) and is contiguous (end-to-end) with the first trench 220, and an intrusion (negative projection, depression) 240 within the second trench 230 which extends yet deeper into the substrate. Contact elements will be fabricated in these trenches, then will need to be "released" from the trenches.

In a next step of the process 200, illustrated in FIG. 2G, one or more metallic layers are blanket deposited, such as by sputtering, onto the substrate 202. For example, a layer 252 of aluminum followed by a layer 254 of copper. Exemplary thicknesses for these layers are:

5000–50,000 Å, preferably 20,000 Å for the first layer 252; and

1000–50,000 Å, preferably 5,000 Å for the second layer 254.

The purposes of these layers 252 and 254 are generally:

the first layer 252 is a material (such as aluminum) selected for its eventual use as a "release" layer (described hereinbelow); and the second layer 254 serves as a "seed" layer for deposition of a subsequent layer (256, described hereinbelow) and, in the case of a previous aluminum layer 252, will prevent the subsequent layer 256 from "smutting" as a result of removing the previous "release" layer 252. This layer may be removed from the final spring contact element and may act as a protective "capping" layer during the release process.

Together, the layers 252 and 254 constitute a "release mechanism" which is incorporated into the sacrificial substrate which, in use, permits the sacrificial substrate to be removed after the spring contact elements fabricated thereon (as described hereinbelow) are mounted to the terminals of the electronic component.

Metallic materials forming the resulting contact structures (100, 150) can be deposited into the trenches and features formed therein by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known. Electroplating is a generally preferred technique.

Next, as illustrated in FIG. 2H, a masking layer 258 (compare 206), such as photoresist, is applied to the substrate and is patterned to have an openings 260 corresponding to the length "L" and width ("w1" and "w2", and widths therebetween) of the desired resulting spring contact element (see FIGS. 1A and 1B) A relatively thick "structural" metallic layer 256 is deposited within the openings 260, using any suitable process such as electroplating of a suitable material such as nickel, atop the previously applied layers 252 and 254. This layer 256 is intended to control (dominate) the mechanical characteristics of the resulting spring contact element (100). The opening 260 includes the trench 220, the trench 230, the depression 240 and a portion of the substrate 202 which is adjacent and contiguous with the first trench 220.

An exemplary average ((t1+t2)/2) thickness for this layer 256 is 1–10 mils, preferably 1–5 mils. Suitable materials for the layer 256, such as nickel and its alloys, have been set forth hereinabove.

It is within the scope of this invention that additional layers may be included in the build-up of the contact structure. For example, prior to depositing the layer 256, a layer of a material selected for its superior electrical characteristics of electrical conductivity, low contact resistance, solderability, and resistance to corrosion may be deposited. For example, gold or rhodium (both of which are excellent contact materials), nickel-cobalt (a good material for brazing), gold (another good material for brazing), and the like.

In a next step of the process 200, illustrated in FIG. 2I, the masking layer 258 is removed, exposing the layers 252 and 254. These layers are suitably selectively chemically etched, so that all that remains on the substrate is an elongate structure 270 (compare 100) having a one end 272 (compare 102), an other end 274 (compare 104), a central portion 276 (compare 106) and a raised topological feature 278 (compare 108) at its end 274. This elongate structure 270 is the resulting spring contact element.

FIG. 2J is another cross-sectional view of the resulting structure 270, still resident upon the substrate, with the layers 252 and 254 omitted, for illustrative clarity. The similarity between this structure 270 and the spring contact element 100 of FIG. 1A is readily apparent.

One having ordinary skill in the art to which the present invention most nearly pertains will recognize that the processes described hereinabove can readily be performed at a plurality of locations on a sacrificial substrate to result in a plurality of contact structures (270) having been fabricated at a plurality of precisely-controlled predetermined locations on the substrate 202. The process has been described with respect to one exemplary structure 270 being fabricated at one location, for purposes of illustrative clarity.

It is within the scope of this invention that rather than patterning a sacrificial substrate to have a plurality of trenches, each corresponding to a single resulting contact element, that a sacrificial substrate can be prepared with a single very wide set of trenches, (220, 230, 240), then deposit the metals (252, 254, 256), then perform an additional final masking and etching step to define the individual contact elements. Such a process would look similar to the process described hereinabove with respect to FIGS. 2A–2G, followed by blanket deposition of the metal (256) layers, followed by masking and etching to define the individual contact elements.

An Alternate Embodiment

FIGS. 3A and 3B illustrate another one of many possible embodiments for a contact structure 300 fabricated by the techniques described hereinabove. Instead of a flat connection tab (see 110), a somewhat truncated-pyramidal joining feature (stud) 310 is fabricated as an attachment feature at the base portion 304 of the contact structure 300. When the contact structure 300 is mounted to a substrate, such as a space transformer, this stud 310 will allow for some misalignment tolerance during assembly. The remaining portions of the contact structure 300 are comparable to those described hereinabove with respect to the contact structure 270 -namely, a central main body portion 306 (compare 276), a contact end portion 304 (compare 274), and a feature 308 (compare 278).

Thus, there has thus been shown an exemplary process for fabricating elongate resilient (spring) interconnection (contact) elements on a sacrificial substrate. This can be considered to be an "interim" product, awaiting further use, as follows:

Alternative A: These spring contact elements can simply be removed from the sacrificial substrate, resulting in a "bucket of springs" which may be attached, such as with automated equipment, to an electronic component, although the benefit of having lithographically (i.e., to very close tolerances) located the plurality of spring contact elements with respect to one another would be lost.

Alternative B: A more "viable technique for installing the spring contact elements onto an electronic component, involving removing the sacrificial substrate after the contact structures resident thereon are mounted (by the base ends) to an electronic component or to a substrate, is described hereinbelow with respect to FIGS. 4A–4C.

Removing the Sacrificial Substrate

With regard to either of the alternatives ("A" or "B", set forth hereinabove, a suitable mechanism must be employed for removing the sacrificial substrate (i.e., releasing the fabricating contact elements from the sacrificial substrate whereupon they reside). Exemplary suitable mechanisms include, but are not limited to:

chemically etching to release the contact structures (e.g., 270) from the sacrificial substrate (202). As mentioned above, the aluminum layer 252 is readily selectively etched to cause separation of the contact structure 270 from the substrate 202. (The copper layer 254 helps prevent contamination of the layer 256 in such a process, and may ultimately be etched from the separated contact structure 270.)

in lieu of the aluminum and copper layers described hereinabove, employing layers of materials that are non-wetting with respect to one another and/or that ball up when heated (e.g., lead, indium, tin), then heating the substrate 202 to cause the contact structures 270 to be released therefrom.

Mounting the Contacts to a Substrate

As mentioned hereinabove, a plurality of contact structures (e.g., 270) fabricated upon a sacrificial substrate (e.g., 202) can be mounted (affixed) to another substrate or to an electronic component such as a space transformer.

FIG. 4A illustrates a technique 400 wherein a plurality (two of many shown) of contact structures 402 (compare 100, 150, 270, 300) have been fabricated on a sacrificial substrate 404 (compare 202). The base end portions (compare 310) of the contact structures 402 are brought into contact with a corresponding plurality of terminals 406 on an electronic component 408 such as the aforementioned space transformer of a probe card assembly, whereupon the base end portions are suitably soldered or brazed 410 to the terminals 406.

It is within the scope of this invention that any suitable technique and/or material for affixing the base end portions of the contact structures (402) to terminals of an electronic component be employed, including brazing, welding (e.g., spot welding), soldering, conductive epoxy, tacking the contact structure in any suitable manner to the terminal and securely affixing the contact structure to the terminal by plating (e.g., electroplating), and the like.

The sacrificial substrate 404 is now removed, in any suitable manner such as those described hereinabove (e.g., chemical etching, heating), resulting in an electronic component (408) having spring contact elements (402) affixed thereto, as illustrated in FIG. 4B.

As is evident in FIG. 4B, a plurality of elongate spring contact elements can be mounted to an electronic component having a plurality of terminals on a surface thereof. Each spring contact element has a base end and a contact end opposite the base end, and is mounted by its base end to a corresponding terminal of the electronic component. The contact end of each spring contact element extends above the surface of the electronic component to a position which is laterally offset from its base end.

As mentioned hereinabove, when mounted, the contact structure 402 (compare 100) has an "effective" length of "L1", this being the length between the tip feature (compare 108) and the inwardmost position whereat the base end (compare 102) is affixed to the component 408. The "effective" length represents the length over which the contact structure can deflect in response to compressive forces applied at the tip end thereof (e.g., at the tip feature).

FIG. 4C illustrates an application for the spring contact elements (resilient contact structures) of the present invention wherein the spring contact elements have been mounted in the manner described with respect to FIG. 4B to a space transformer component (408) of a probe card assembly (not shown) so that the contact features (compare 308) at their contact ends (compare 304) make pressure connections with terminals 422 of an electronic component 420 such as a semiconductor device, or an area of a semiconductor wafer (not shown) containing a plurality of semiconductor devices. As described hereinabove, with respect to FIG. 1E, it is within the scope of this invention that separate and discrete contact tip structures (168) be affixed to the contact end portions of the spring contact element.

It is within the scope of this invention that the substrate (component) to which the structures 402 are mounted, for example the component 408 illustrated in FIG. 4C are active components, such as ASICs.

It is also within the scope of the invention, as is illustrated in FIG. 4C, that the component or substrate to which the structures (e.g., 402) are mounted can be provided with a contiguous (as illustrated) or segmented ground plane to control impedance. Such a ground plane may comprise a plurality of ground lines 412 aligned directly underneath the structures 402, but sufficient clearance for the tip of the structure to deflect must be assured. Alternatively, the ground plane 412 can be covered with an insulating layer. Another approach would be to dispose ground plane lines 414 on the surface of the substrate 408 slightly (such as 1 mil, in the x-axis) offset from directly underneath the structures 402, and laying parallel to the structure.

FIG. 4D illustrates an alternate embodiment 440 of the present invention wherein a cavity (trench) 442 is been formed in the surface of the substrate or component 444 (compare 408) to which the contact structures 450 (compare 402) have been mounted. The trench 442 is located so that it is underneath at least the contact end portion 454 (compare 104) of the contact structure, and preferably extends underneath a substantial portion of the contiguous central body portion 456 (compare 106) of the spring contact element. The trench extends of a depth "d4" within the substrate 444 a suitable distance to allow for a greater range of deflection of the contact end portion 454 when, in use, it is urged against an electronic component (see, e.g., FIG. 4C). In FIG. 4D, one trench 442 is illustrated extending under a plurality (two of many shown) spring contact elements. It is within the scope of this invention that there is a single discrete trench under each of the plurality of spring contact elements (450) structures mounted to an electronic component (444).

FIG. 4E illustrates an alternate embodiment of the present invention wherein a spring contact element 460 is mounted to an electronic component 470 (compare 444) via a stud 472 extending from a surface of the electronic component 470. The base end 462 of the spring contact element 460 is suitably brazed to the stud 472. The stud 472 suitably has a height in the range of 3–4 mils.

FIG. 4E also illustrates an alternate embodiment of the present invention wherein the spring contact element 460 is formed with but a single step or offset (rather than two steps). As illustrated herein, the offset of the base end portion 462 from the central body portion 466 (compare "d2" in FIG. 1A) is ZERO.

In other words, in this example, the base end portion 462 is coplanar with the central body portion 466. Since there is no offset at the base end portion, the base end 462 is mounted to a stud 472 on the surface of the electronic component 470 so that the body portion 466 is elevated above the surface of the component 470. The contact end portion 464 (compare 104) preferably remains offset by a distance "d1" from the central body portion 466. As suggested by this figure, many of the variations (alternate embodiments) of the present invention can be combined (mixed and matched) to arrive at a desired arrangement of spring contact elements affixed to an electronic component.

FIG. 4F illustrates another embodiment of the invention wherein the spring contact element (contact structure) 480 is formed without any step or offset (rather than one or two steps) As in the previous example, the offset of the base end portion 482 from the central body portion 486 (compare "d2" in FIG. 1A) is ZERO, and the base end portion 482 is coplanar with the central body portion 486. Since there is no offset at the base end portion, the base end 482 is mounted to a stud 492 on the surface of the electronic component 490 so that the body portion 486 is elevated above the surface of the component 490. Also, the offset of the contact end portion 484 (compare 104) from the central body portion 486 (compare "d1" in FIG. 1A) is ZERO, and the contact end portion 484 is coplanar with the central body portion 486. Since there is no offset at the contact end portion, a prefabricated contact tip structure 488 (compare 168) may be affixed (e.g., joined, such as by brazing) to the contact end 484 so that the body portion 486 will be spaced away from a component (not shown, compare 420) being contacted by the contact structure 480.

Probe Applications

FIG. 5 illustrates an application wherein a plurality of spring contact elements 500 such as those described hereinabove are arranged on a substrate such as a space transformer, and affixed thereto in the manner described hereinabove, so that their contact ends are disposed in a manner suitable for making contact with the bond pads of a semiconductor device having its bond pads arranged along its periphery.

Each contact element 500 (compare 100) has a base end 502 (compare 102) and a contact end 504 (compare 104), and are mounted to an electronic component such as a space transformer component (schematically illustrated by the dashed line 510) of a probe card assembly. The contact ends 504 are arranged close to one another, in a pattern mirroring that of the bond pads 522 (illustrated schematically by circles) of an electronic component (schematically illustrated by the dashed line 520) such as a semiconductor device. The spring contact elements 500 "fan-out" from their contact ends 504, so that their base ends 502 are disposed at a greater pitch (spacing from one another) than their contact ends 504.

FIG. 6 illustrates another application wherein a plurality of spring contact elements 600 such as those described hereinabove are arranged on a substrate such as a space transformer, and affixed thereto in the manner described hereinabove, so that their contact ends are disposed in a manner suitable for making contact with the bond pads of a semiconductor device having its bond pads arranged in a row along a centerline thereof.

Each spring contact element (compare 100), generally denoted by the reference numeral 600, has a base end 602 (compare 102) and a contact end 604 (compare 104), and are mounted to an electronic component such as a space transformer component (schematically illustrated by the dashed line 610) of a probe card assembly (not shown). The contact ends 604 are arranged close to one another, in a pattern mirroring that of the bond pads 622 (illustrated schematically by circles) of an electronic component (schematically illustrated by the dashed line 620) such as a semiconductor device. The spring contact elements 600 are arranged in the following sequence:
  a first spring contact element 600a is relatively short (e.g., has a length of 60 mils ), and is disposed to extend towards a one side (right, as viewed) of the electronic component 620;
  a second spring contact element 600b, adjacent the first spring contact element 600a, is also relatively short (e.g., has a length of 60 mils ), and is disposed to extend towards an opposite side (left, as viewed) of the electronic component 620;
  a third spring contact element 600c, adjacent the second spring contact element 600b, is relatively long (e.g., has a length of 80 mils ), and is disposed to extend towards the one side (right, as viewed) of the electronic component 620; and
  a fourth spring contact element 600d, adjacent the third spring contact element 600c, is also relatively long (e.g., has a length of 80 mils ), and is disposed to extend towards the opposite side (left, as viewed) of the electronic component 620. In this manner, the contact ends 604 are disposed at a fine-pitch commensurate with that of the bond pads 622, and the base ends 602 are disposed at a significantly greater pitch from one another.

The showing of only two different-length contact structures is merely exemplary and it should be understood that it is within the scope of this invention that a plurality of spring contact elements having more than two different lengths can be disposed on a common substrate. The showing of only two different-length contact structures is merely exemplary.

It is within the scope of this invention that the techniques illustrated in FIGS. 5 and 6 may be used to generate a plurality of probes (spring contact elements) in any arrangement required for probing of either peripheral or lead-on-center (LOC) devices.

Additional Features and Embodiments

In cases where there are a plurality of spring contact elements mounted to a substrate and they are of different lengths (see, e.g., FIG. 6), and assuming that the cross-sections and metallurgy of the spring contact elements are the same as one another, the different length spring contact elements will evidently exhibit different reactive forces (spring constants, k).

It is therefore within the scope of this invention that the spring constants of a plurality of spring elements exhibiting different spring constants can be adjusted (tailored), on an individual basis, to make them more uniform with one another.

FIG. 7A illustrates a technique for tailoring spring constant. In this example, a spring contact element 700 (compare 450) is mounted by its base end 702 (compare 452) to an electronic component 710 (compare 444). A trench 712 (compare 442) is formed in the surface of the electronic component 710 and extends from under the contact end 704 (compare 454) of the spring contact structure 700, along the body portion 706 (compare 456) thereof, towards the base end 702 of the spring contact element 700 to a position (point) "P" which is located a prescribed, fixed distance, such as 60 mils from the contact end 704. When a force is applied downwards to the contact end 704, the entire spring contact element 700 will bend (deflect) until the body portion 706 contacts the end of the trench 712 at the point "P", whereupon only the outermost portion (from the point "P" to the end 704) of the spring contact element is permitted to deflect. The outermost portion of the spring contact element has an 'effective' length of "L1". The outermost portion of the spring contact element has an 'effective' length of "L1". In this manner, the reaction to applied contact forces can be made uniform among spring contact elements of various lengths (so long as the point "P" falls somewhere within the central body portion of the spring contact element).

FIG. 7B illustrates another technique for tailoring spring constant. In this example, a spring contact element 720 (compare 450) is mounted by its base end 702 (compare 452) to an electronic component 710 (compare 444). A structure 732 (compare 712) is formed on the surface of the electronic component 730 (compare 710) at a location between the base end 722 of the spring contact structure 720, between the surface of the electronic component 730 and the central body portion 726 (compare 706) of the spring contact element 720 and extends along the body portion 726 (compare 706) thereof, towards the contact end 724 of the spring contact element 720 to a position (point) "P" which is located a prescribed, fixed distance, such as the aforementioned (with respect to FIG. 7A prescribed distance, from the contact end 724. The structure is suitably a bead of any hard material, such as glass or a pre-cut ceramic ring, disposed on the surface of the electronic component 730. When a force is applied downwards to the contact end 724, only the outermost portion (from the point "P" to the end 724) of the spring contact element is permitted to deflect. As in the previous embodiment, the reactions to applied contact forces can be made uniform among spring contact elements of various lengths.

FIG. 7C illustrates yet another technique for tailoring spring constant. In this example, a spring contact element 740 (compare 720) is mounted by its base end 742 (compare 722) to an electronic component 750 (compare 730). An encapsulating structure 752 (compare 732) is formed on the surface of the electronic component 750 in a manner similar to the structure 732 of the previous embodiment. However, in this case, the structure 752 fully encapsulates the base end 742 of the spring contact structure 740 and extends along the body portion 746 (compare 726) thereof, towards the contact end 744 thereof, to a position (point) "P" which is located a prescribed, fixed distance, such as the aforementioned (with respect to FIG. 7B prescribed distance, from the contact end 744. The outermost portion of the spring contact element has an 'effective' length of "L1". As in the previous embodiment, when a force is applied downwards to the contact end 744, only the outermost portion (from the point "P" to the end 744) of the spring contact element is permitted to deflect. As in the previous embodiment, the reactions to applied contact forces can be made uniform among spring contact elements of various lengths.

FIG. 7D illustrates yet another technique for tailoring spring constant. In this example, a spring contact element 760 (compare 740) is mounted by its base end 762 (compare 742) to an electronic component 770 (compare 750). In this example, the body portion 766 is formed with a "kink" 772 at a position (point) "P" which is located a prescribed, fixed distance, such as the aforementioned (with respect to FIG. 7C prescribed distance, from the contact end 764. The outermost portion of the spring contact element has an effective, length of "L1". As in the previous embodiment, when a force is applied downwards to the contact end 744, only the outermost portion (from the point "P" to the end 744) of the spring contact element is permitted to deflect. (The kink 772 can be sized and shaped so that the entire contact structure deflects slightly before the kink 772 contacts the surface of the component 770, after which only the outermost portion of the spring element will continue to deflect.) As in the previous embodiment, the reactions to applied contact forces can be made uniform among spring contact elements of various lengths.

It is within the scope of this invention that other techniques can be employed to "uniformize" the spring constants among contact elements having different overall lengths ("L"). For example, their widths and or "α" taper can be different from one another to achieve this desired result.

Alternate Embodiment

The spring contact elements illustrated and described hereinabove have been elongate and linear (disposed along the y-axis), generally best suited to accommodate movement (deflection) in the z-axis (i.e., normal to the component or substrate to which they are mounted).

It is within the scope of this invention that additional "dimensionality" and commensurate additional freedom of movement be incorporated into the resulting spring contact element.

FIG. 8A illustrates a spring contact element 800 that has been fabricated according to the techniques set forth hereinabove, with the exception (noticeable difference) that the central body portion 806 (compare 106) of the contact element is not straight, Although it may still lay in a plane (e.g., the x-y plane), it is illustrated as jogging along the x-axis while traversing the y-axis, in which case the base end 802 (compare 102) will have a different x-coordinate than the contact end 804 (compare 104) or the contact feature 808 (compare 108) disposed at the contact end 804.

FIG. 8B illustrates a spring contact element 850 that is similar in many respects to the spring contact element 800 of FIG. 8A, with the exception that there is a step between the central body portion 856 (compare 806) and the base portion 852 (compare 802) in addition to the step between the central portion 856 and the contact end portion 854 (compare 804). The contact element 850 is illustrated with a contact feature 858 (compare 808) at its contact end 854.

Controlled Impedance

For use in probing semiconductor devices, particularly at speed testing, it is advantageous that the spring contact element have controlled impedance.

FIGS. 9A–9C illustrate a technique 900 for achieving controlled impedance in a spring contact element, according to the invention.

In a first step, best viewed in FIG. 9A, a spring contact element 900 (compare 700) is mounted by its base end 902 (compare 702) to a terminal 912 of an electronic component 910 (compare 710) such as a space transformer component of a probe card assembly. The contact tip end 904 (compare 704) is elevated above the surface of the component 9140 and is illustrated as having a contact feature. The spring contact structure has a central body portion 906 (compare 706) between its base and tip ends.

In a next step, best viewed in FIG. 9B, the tip end 904 of the spring contact element is masked (not shown), and a suitable thin (e.g., 1–10 µm) insulating layer 920, such as parylene, is deposited, such as by vapor deposition, onto all but the tip end 904 of the spring contact element, and adjacent surface of the electronic component.

In a next step, best viewed in FIG. 9B, while the tip end 904 of the spring contact element is still masked (not shown), a suitable thin (e.g., less than 0.25 mm) layer 922 of conductive material, such as any of the conductive metal material described herein, is deposited, such as by sputtering, onto all but the tip end 904 of the spring contact element, and adjacent surface of the electronic component. Finally, the tip end 904 is unmasked. This results in the central body portion 906 of the spring contact element being enveloped by a conductive layer 922, with an insulating layer 920 therebetween.

The conductive layer 922 is suitably connected to ground to function as a ground plane and control the impedance of the resulting spring contact element. For example, as best viewed in FIG. 9B, the component 910 is provided with a second terminal 914 which is electrical ground. This terminal 914 is suitably masked along with the tip end 904 of the spring contact element prior to applying the insulating layer 920, so that the subsequent conductive layer 922 will also deposit thereon and be connected thereto.

Evidently, this thicknesses of the layers 920 and 922 need only be sufficient to be continuous, and to provide the sought after controlled impedance, and should not be so thick as to interfere with the mechanical operation of the spring contact element. The representations in FIGS. 9B and 9C are not drawn to scale.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other variations" on the "themes" set forth hereinabove will occur to one having ordinary skill in the art to which the present invention most nearly pertains, and such variations are intended to be within the scope of the invention, as disclosed herein.

For example, the resulting spring contact elements may be heat-treated to enhance their mechanical characteristics, either while they are resident upon the sacrificial substrate or after they are mounted to another substrate or an electronic component. Also, any heat incident to mounting (e.g., by brazing) the spring contact elements to a component can advantageously be employed to "heat treat" the material of the spring contact element.

For example, a comparable spring contact element could be fabricated without etching into the sacrificial substrate, by disposing multiple layers of photoresist (masking material) onto a substrate, forming openings therein, seeding the opening for electroplating or the like, building up a metallic mass within the opening, and removing the photoresist. Such a technique would be particularly well suited to fabricating spring contact elements directly upon active semiconductor devices.

For example, it is within the scope of this invention that the contact structure can be fabricated on or attached to active semiconductor devices.

What is claimed is:

1. Method of mounting a plurality of spring contact elements to terminals of an electronic component, comprising:
    fabricating a plurality of spring contact elements upon a sacrificial substrate;
    subsequently, while the spring contact elements are resident on the sacrificial substrate, mounting ones of the spring contact elements to terminals of an electronic component; and
    after the ones of the spring contact elements are mounted to the terminals of the electronic component, removing the sacrificial substrate.

2. Method, according to claim 1 wherein:
    the electronic component is a space transformer.

3. The method of claim 1, wherein the electronic component is made separately from the spring contact elements and prior to the mounting of the ones of the spring contact elements to the electronic component.

4. The method of claim 1, wherein each of the spring contact elements comprises a base portion configured for mounting to the terminals of the electronic component, a tip portion configured to contact another component, and a body portion between the base and the tip portion, said method further comprising forming trenches in the sacrificial substrate, each of the trenches defining a contour of the body portion of one of the spring contact elements.

5. The method of claim 1, wherein the ones of the spring contact elements are configured to form pressure based electrical connections with another electronic component while the ones of the spring contact elements are pressed against the other electronic component.

6. A method of mounting a plurality of spring contact elements to an electronic component, comprising:
    providing a plurality of elongate spring contact elements, each having a base end, a contact end, and a central body portion therebetween; and
    mounting the base ends of ones of the spring contact elements to corresponding terminals on the electronic component, the contact ends of the ones of the spring contact elements extending above the surface of the electronic component and the body portions of the ones of the contact elements being spaced from the electronic component.

7. The method of claim 6, wherein the electronic component is made separately from the spring contact elements and prior to the mounting of the base ends of the ones of the spring contact elements to the electronic component.

8. The method of claim 6, wherein the ones of the spring contact elements are configured to form pressure based electrical connections with another electronic component while the contact ends of the ones of the spring contact elements are pressed against the other electronic component.

9. Method, according to claim 6, wherein:
    the electronic component is a space transformer of a probe card assembly.

10. Method, according to claim 6, wherein:
    the electronic component is a semiconductor.

11. Method of making comprising steps of:
    fabricating a contact element on a sacrificial substrate;
    mounting said contact element to an electronic component, wherein said electronic component is made separately from said contact element and prior to said mounting of said contact element to said electronic component; and
    releasing said contact element from said sacrificial substrate.

12. The method of claim 11, wherein said electronic component comprises a terminal, and said step of mounting comprises attaching said contact element to said terminal.

13. The method of claim 11, wherein said electronic component comprises a stud, and said step of mounting comprises attaching said contact element to said stud.

14. The method of claim 11, wherein said step of fabricating comprises:
    forming a masking layer on said sacrificial substrate; and
    depositing contact element material in an opening in said masking layer.

15. The method of claim 11, wherein said step of fabricating comprises:
    forming a trench in said sacrificial substrate, said trench defining a contour of said contact element.

16. The method of claim 15, wherein said step of forming a trench further comprises:

forming a plurality of said trenches configured such that said contour is multilevel.

17. The method of claim 11, wherein the contact element is configured to form a pressure based electrical connection with another electronic component while the contact element is pressed against the other electronic component.

18. The method of claim 16, wherein said multilevel contour comprises a first level and a second level, said first level defining a body portion of said contact element, and said second level defining a contact portion of said contact element.

19. The method of claim 16, wherein said step of forming a trench further comprises forming a depression in one of said trenches, said depression defining a tip feature of said contact element.

20. The method of claim 15, wherein:

said contact element comprises a base portion configured for mounting to said electronic component, a tip portion configured to contact another component, and a body portion between said base and said tip portion, and said trench defines a contour of said body portion.

21. The method of claim 11, wherein said contact element comprises a base portion and a contact portion, and wherein said step of mounting comprises attaching said base portion to said electronic components.

22. The method of claim 21, wherein said contact element further comprises a body portion disposed between said base portion and said contact portion such that said contact portion is spaced away from said electronic component after said base portion is attached to said electronic component.

23. The method of claim 11, wherein said step of mounting is performed prior to said step of releasing.

24. The method of claim 11, wherein:

said step of fabricating further comprises fabricating a plurality of said contact elements on said sacrificial substrate;

said step of mounting further comprises mounting said plurality of contact elements on said electronic component; and said step of releasing further comprises releasing said plurality of contact elements from said sacrificial substrate.

25. The method of claim 24, wherein said step of fabricating a plurality of said contact elements comprises forming a plurality of trenches in said sacrificial substrate, said plurality of trenches defining contours of said contact elements.

26. The method of claim 24, wherein:

each of said contact elements comprises a base portion configured for mounting to said electronic component, a tip portion configured to contact another component, and a body portion between said base and said tip portion, and each of said trenches defines a contour of a body portion of one of said contact elements.

27. The method of claim 25, wherein said plurality of trenches are configured such that said contours are multilevel.

28. The method of claim 27, wherein each said multilevel contour comprises a first level and a second level, said first level defining a body portion of one of said contact elements, and said second level defining a contact portion of said one of said contact elements.

* * * * *